(12) United States Patent
Hadizad

(10) Patent No.: US 7,038,295 B2
(45) Date of Patent: May 2, 2006

(54) DC/DC CONVERTER WITH DEPLETION MODE COMPOUND SEMICONDUCTOR FIELD EFFECT TRANSISTOR SWITCHING DEVICE

(75) Inventor: Peyman Hadizad, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 160 days.

(21) Appl. No.: 10/623,390

(22) Filed: Jul. 18, 2003

(65) Prior Publication Data

US 2005/0029993 A1 Feb. 10, 2005

(51) Int. Cl.
*H01L 29/00* (2006.01)

(52) U.S. Cl. .................. 257/528; 257/329; 257/330

(58) Field of Classification Search .............. 257/329, 257/302, 328, 330
See application file for complete search history.

(56) References Cited

U.S. PATENT DOCUMENTS

| | | | |
|---|---|---|---|
| 4,262,296 A | | 4/1981 | Shealy et al. |
| 5,231,037 A | | 7/1993 | Yuan et al. |
| 5,610,085 A | * | 3/1997 | Yuan et al. ............ 438/187 |
| 6,356,059 B1 | | 3/2002 | Yu |
| 6,628,532 B1 | * | 9/2003 | Rinne et al. ............ 363/21.06 |
| 2001/0050393 A1 | * | 12/2001 | Lotfi et al. ............ 257/329 |

FOREIGN PATENT DOCUMENTS

EP 0874394 10/1998

\* cited by examiner

*Primary Examiner*—Caridad Everhart
(74) *Attorney, Agent, or Firm*—Kevin B. Jackson

(57) ABSTRACT

In one embodiment, a dc/dc converter network (71) is described. The converter network (71) includes at least one GaAs depletion mode or normally on FET device (711, 712). The converter network (71) is a two-port system having a positive input terminal (710), a positive output terminal (730), and a negative input terminal (720) connected to a negative output terminal (740). A first GaAs depletion mode FET (711) is connected between the positive input terminal (710) and an internal node (795). A second GaAs depletion mode FET (712) is connected between the internal node (795) and the common negative terminals (720, 740). A control circuit (780) is connected gate leads of the two FETs (711, 712), to alternatively switch the devices from a current conducting mode to a current blocking mode. An inductor (760) is connected between the internal node (795) and the positive output terminal (730). The GaAs depletion mode devices provide a converter network with improved performance.

18 Claims, 3 Drawing Sheets

DC/DC CONVERTER WITH DEPLETION MODE COMPOUND SEMICONDUCTOR FIELD EFFECT TRANSISTOR SWITCHING DEVICE

RELATED APPLICATIONS

This application is related to U.S. patent application Ser. No. 10/623,397, entitled "VERTICAL COMPOUND SEMICONDUCTOR FIELD EFFECT TRANSISTOR STRUCTURE", now U.S. Pat. No. 6,818,939, by Peyman Hadizad, assigned to the same assignee, Semiconductor Components Industries, LLC, filed concurrently herewith, and which is incorporated by reference for all purposes.

This application is further related to U.S. patent application Ser. No. 10/623,392, entitled "METHOD OF MAKING A VERTICAL COMPOUND SEMICONDUCTOR FIELD EFFECT TRANSISTOR DEVICE", by Peyman Hadizad, assigned to the same assignee, Semiconductor Components Industries, LLC, filed concurrently herewith, and which is incorporated by reference for all purposes.

BACKGROUND OF THE INVENTION

This invention relates generally to high frequency power semiconductor applications, and more specifically to dc/dc converters using field effect transistor (FET) switching devices.

In the area of computer and peripheral power supply applications, there are several factors driving future performance and demand. Such factors include an increase in output power requirements because of higher microprocessor speeds, smaller system size (i.e., reduced circuit board space), lower cost, improved transient response, and lower output voltage ripple (i.e., lower microprocessor operating voltages). Additionally, advancing microprocessor needs, which include decreasing operating voltage and increasing current requirements, will require power conversion devices and circuits that enable highly efficient and tightly regulated power. These devices and circuits must operate at higher frequencies and exhibit enhanced thermal characteristics.

Electronic systems such as computer and peripheral power supply applications often require that multiple dc voltage levels be produced from a single dc voltage source. This conversion is done with electronic circuits such as dc/dc converters. A basic converter circuit is a two-port network having a pair of input terminals and a pair of output terminals. A dc power source is coupled across the two input terminals, and a dc load is coupled across the two output terminals. Within the two-port network, the circuit typically comprises multiple switching devices, appropriate control circuitry, one or more capacitors, and one or more inductors. Typical dc/dc converters include the buck converter, the boost converter, and the buck-boost converter.

An ideal switching device has two states: on and off. In the on state, the ideal device conducts current between two terminals with zero voltage drop across the terminals. In the off state, the ideal device will support any voltage drop across the terminals while conducting zero current between them. A number of different semiconductor devices are used as switches in dc/dc converters, all of which depart from the ideal switching device in one or more ways. Examples of such devices include diodes, bipolar transistors, MOSFETs, silicon controlled rectifiers, and junction field effect transistors.

One problem with typical switching devices is a non-zero voltage between the terminals when in the on state. This results in power dissipation in the switching device, which generates heat and reduces overall circuit efficiency. A second problem involves the dynamic characteristics of the switching device when transitioning between the on state and the off state. Slow switching speeds place a limit on system operating frequency and duty cycle. Each time a device switches between states, a certain amount of energy is lost. The slower a device switches, the greater the energy lost in the circuit. This has significant impact on high frequency and/or high power applications, and contributes significantly to the reduction of overall efficiency of a dc/dc converter.

Most losses in switching power circuits are determined by the physical properties of semiconductor devices. Although silicon based MOSFET devices are a primary choice for many power conversion applications, they have inherent limitations for high frequency applications due to their physical structure. Such limitations include high reverse recovery charge, high gate charge, and high on resistance, which detrimentally impact power dissipation and thermal response characteristics.

Multi-phase dc/dc conversion is a preferred technique for addressing the high current/low operating voltage requirements of present and future microprocessors. In multiphase dc/dc converter architectures, a load is distributed evenly across phase-shifted pulse-width-modulation (PWM) channels and associated switching devices and inductors. This approach spreads power and current dissipation across several power handling devices thereby lowering stress on components. This approach also reduces output ripple on inductor current.

By way of example, a typical silicon-based multi-phase dc/dc converter for a 120 Amp, 500 kHz microprocessor system consists of four phases. A silicon-based multi-phase dc/dc converter for 1 MHz/120 Amp microprocessor system may consist of five phases, and a silicon-based multi-phase dc/dc converter for a 2 MHz/120 Amp system may consist of seven phases.

In multi-phase dc/dc converters, current levels are often sensed in each phase as a means of feedback control within a system. This is done typically using on-resistance of a silicon switching MOSFET device or series resistance of an output inductor. The on-resistance method current sensing is problematic due to variations in processing for silicon MOSFETs devices, which becomes even more of a problem at higher current levels. Additionally, with improvements in inductor designs and fabrication methods, the series resistance current sensing technique has become less reliable because the improvements make it difficult to distinguish the inductor resistance from system noise.

Accordingly, a need exists for power conversion systems suitable for the increasingly stringent demands of computer and peripheral power supply applications. Additionally, it would beneficial for such systems to include cost effective and reliable switching devices.

DETAILED DESCRIPTION OF THE DRAWINGS

In general, the present invention pertains to a dc/dc power conversion circuit or network that includes at least one compound semiconductor depletion mode junction field effect transistor (JFET) structure. In a preferred embodiment, the circuit includes at least one GaAs depletion mode FET as a switching device. The switching device reduces gate charging effects, gate resistance effects, reverse recovery times, and on resistance thereby improving power conversion performance.

Unlike silicon, GaAs is a direct bandgap compound semiconductor material with an inherent property of high electron mobility (8500 cm$^2$/V-sec), which is greater than 4× that of silicon (1500 cm$^2$/V-sec). Also, GaAs has a larger bandgap of 1.42 eV compared to 1.1 eV for silicon, which provides, among other things, enhanced performance at elevated temperatures. Additionally, the reverse recovery charge of a GaAs FET device is approximately 100× lower than that of a silicon FET device.

The present invention is better understood by referring to FIGS. 1–5 together with the following detailed description. For ease of understanding, like elements or regions are labeled the same throughout the detailed description and FIGURES where appropriate. Although the embodiments shown and described include an n-channel depletion mode FET device, the system according to the present invention is suitable for p-channel devices as well.

Figure 1:
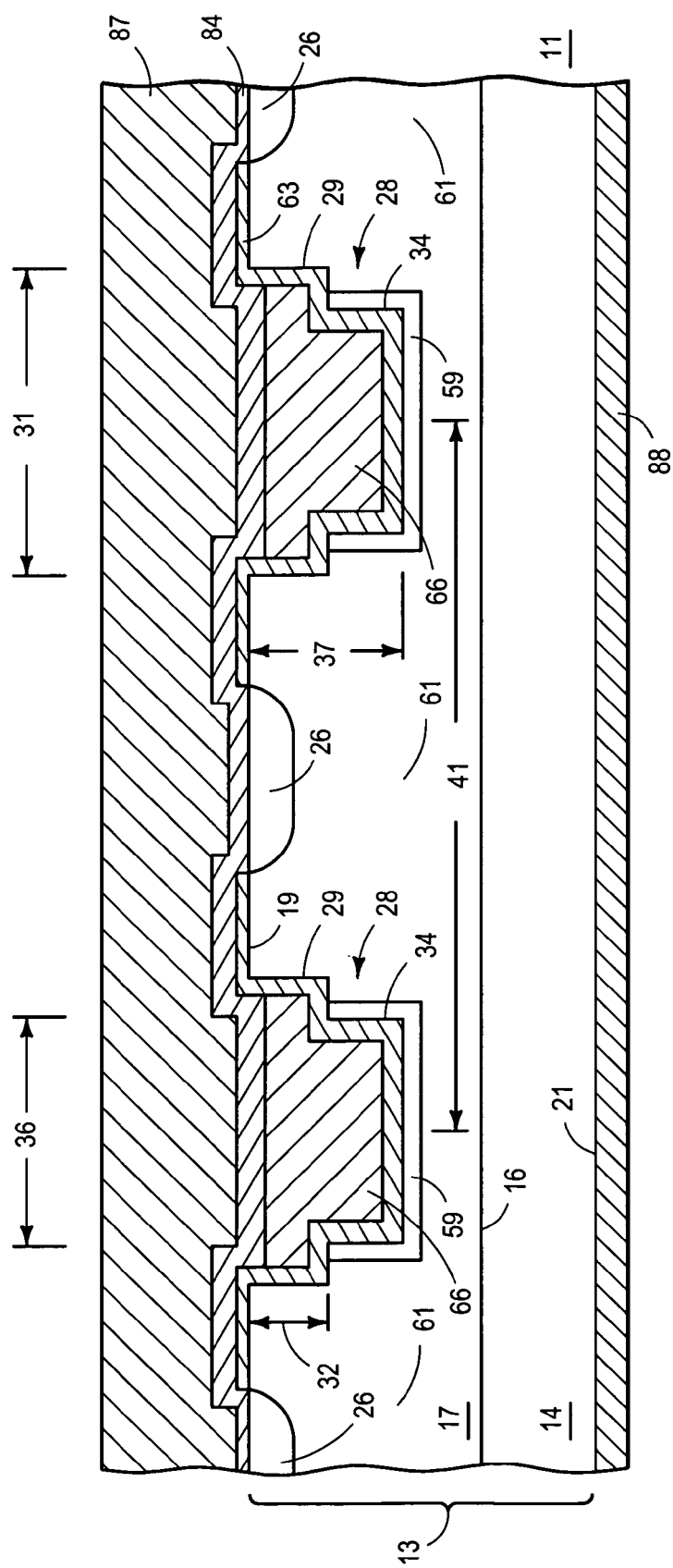
FIG. 1 illustrates, an enlarged cross-sectional view of a portion of a preferred vertical FET device for use with the present invention.

FIG. 1 shows an enlarged cross-sectional view of a vertical FET device or compound semiconductor vertical FET or JFET structure or switching device 11. Structure 11 comprises a body of semiconductor material 13, which preferably includes a starting or supporting substrate or wafer 14 having an upper surface 16. An epitaxial or drift layer or layers 17 is formed on upper surface 16. Body of semiconductor material 13 includes an upper or source surface 19 and a lower or opposing surface 21. Preferably, body of semiconductor material 13 comprises a compound semiconductor such as GaAs, InP or the like. Although only a portion of a FET device or cell is shown, structure 11 comprises a plurality of individual vertical FET devices or cells connected in parallel.

In a preferred embodiment for an n-channel depletion mode (i.e., normally on) device, substrate 14 comprises n-type GaAs, and layer 17 comprises an n-type GaAs epitaxial layer, which preferably has a lower dopant concentration than substrate 14. The thickness and dopant concentration of layer 17 varies as a function of the desired device characteristics. Preferably, for a depletion mode FET device, layer 17 has a dopant concentration on the order of less than $5\times10^{17}$ atoms/cm$^3$ and a thickness greater than about 0.1 microns. Layer 17 is formed using conventional compound semiconductor epitaxial growth methods. The dopant profile of layer 17 is substantially constant, or the profile is graded depending on desired device characteristics. Alternatively, body of semiconductor material 13 comprises InP.

Source regions 26 are formed in and extend from upper surface 19. When layer 17 comprises an n type material, source regions 26 comprise n+ regions and preferably are formed using ion implantation techniques. For example, source regions 26 are formed using Si$^+$ implantation at a dose sufficient to lower contact resistance to subsequently formed contact layers. For example, a Si$^+$ dose of about $4.0\times10^{13}$ atoms/cm$^2$ with an implant energy on the order of 85 KeV being typical. Alternatively, selenium, tin, or tellurium is used to form source regions 26. In an alternative embodiment, multiple source implants at different implant doses and implant energies are used.

Structure 11 further includes a double trench gate, double groove gate, multiple trench gate, trench within a trench gate, or stepped trench gate structure 28 formed in and extending from upper surface 19 into layer 17. Preferably, trench structure 28 includes a first trench or groove portion 29 having a width 31 in a range from about 0.3 microns to about 1.5 microns, and a depth 32 in a range from about 0.5 microns to about 5 microns.

Trench structure 28 further includes a second trench or groove portion 34 having a width 36 in a range from about 0.25 microns to about 1.4 microns, and a depth 37 in a range from about 0.5 microns to about 5 microns. Preferably, the pitch or centerline-to-centerline distance 41 of adjacent trench gate structures 28 is in a range from about 1.3 to about 4.5 microns. These dimensions are variable according to specific device requirements. That portion of layer 17 between gate structures 28 forms channels or channel regions 61.

Structure 11 also includes doped gate regions 59, which preferably extend along sidewalls and lower surfaces of second trenches 34. For an n-channel device, doped gate regions 59 are p-type, and are formed preferably using angled ion implantation. Preferably, gate regions 59 and source regions 26 are activated using rapid thermal processing with a temperature up to about 900° C. for about 10 to 30 seconds being sufficient.

Trench structures 28 preferably are formed using reactive ion etching (RIE) or damage free electron cyclotron resonance (ECR) etching, which provides clean and straight sidewall features. A chlorine-based etch chemistry is preferred. In a preferred embodiment, second trench 34 is formed using spacers formed on the sidewalls of first trench 29, which are subsequently removed.

A dielectric or passivation layer 63 is formed over upper surface 19 including trench structures 28. Preferably, passivation layer 63 comprises a silicon nitride with a thickness in a range from about 0.05 microns to about 0.3 microns. Preferably, plasma enhanced chemical vapor deposition (PECVD) is used to form passivation layer 63. A dielectric layer is then formed over passivation layer 63, and planarized to form a trench-fill layer 66. Trench-fill layer 66 provides for, among other things, better step coverage for subsequently formed conductive layers, and preferably comprises a low temperature oxide, silicon nitride, or a spin on dielectric. Trench-fill layer 66 is formed using etch-back or chemical mechanical planarization (CMP) techniques.

Openings are then formed in dielectric layer 63 to provide contacts to source regions 26. Additionally, portions of trench-fill layer 66 and passivation layer 63 are removed to expose portions of a gate connecting region 79 (shown in FIG. 2). A first metal or contact layer is formed over upper surface 19, and patterned to provide a source contact 84 and a gate contact 86 (shown in FIG. 2). Source contact layer 84 and gate contact layer 86 preferably comprise NiGeAu, NiGeW, or another suitable metal. A second contact layer or metal layer 87 is formed over source contact 84 and gate contact 86. Second metal layer 87 preferably comprises nickel or gold, and is formed using electroplating or electroless plating techniques. Body of semiconductor material 13 is thinned using a backgrind step, and a back metal or drain contact layer 88 is deposited on lower surface 21. Drain contact layer 88 comprises NiGeAu, or another suitable metal.

Figure 2:
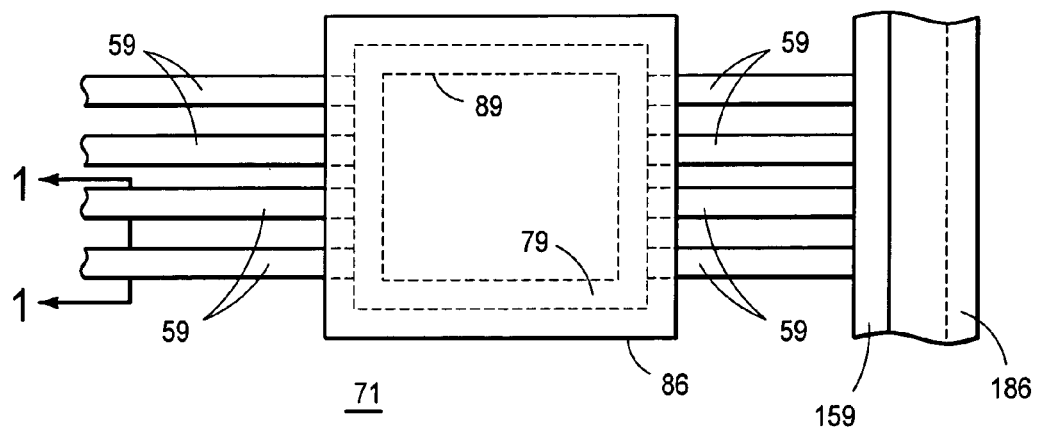
FIG. 2 illustrates a partial top plan view of a gate control structure for device of FIG. 1.
Figure 3:
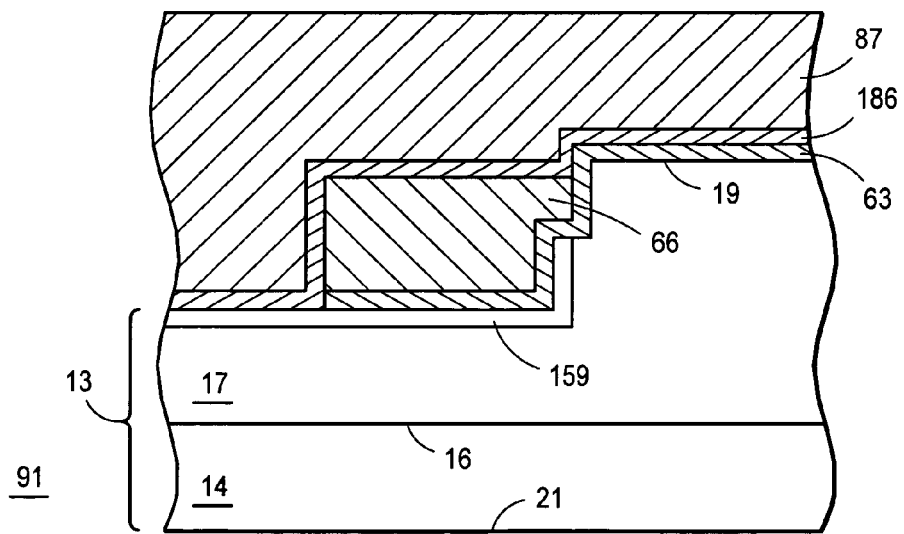
FIG. 3 illustrates an enlarged cross-sectional view of a portion of an edge termination structure for the device of FIG. 1.

FIG. 2 shows an enlarged partial top plan view of a preferred gate contact structure 71, which includes doped connecting region 79. Doped gate connecting region 79 ties or couples together a plurality of doped gate regions 59 in a single contact region. For ease of understanding, structure 11 shown in FIG. 1 is taken along reference line 1—1 of FIG. 2. Phantom line 89 represents an alternative placement for gate contact layer 86. Doped termination region 159 and termination contact layer 186 are part of a preferred termination structure 91, which is described next in FIG. 3.

Termination structure 91 is formed on a periphery or perimeter of vertical FET structure 11. Structure 91 includes a termination region 159 that is formed at the same time as doped gate regions 59, and comprises the same conductivity type (e.g., p-type when structure 11 comprises an n-channel device). Termination structure 91 provides a means for controlling electric field spread and electric field shape during device operation, and preferably is coupled to gate connecting region 79 as shown in FIG. 2.

By using multiple trench structure 28 according to the present invention, gate region 59 is placed deeper into channel regions 61 and is more separated from source regions 26 thereby improving gate blocking characteristics. Also, by using a doped gate region, the blocking characteristics are further improved compared to conventional Schottky gate designs. Also, because structure 11 comprises a compound semiconductor material, structure 11 has a reduced gate charge, reduced gate resistance, and enhanced switching speeds compared to silicon based devices.

In addition, for a given output current and switching frequency, structure 11 dissipates less power thereby allowing one to use a smaller chip size and a reduced number of phases. Additionally, by using a reduced width second trench 34 and gate connecting regions 79 to couple a plurality of gate regions together, the plurality of doped gate regions 59 are placed close together thereby improving device performance. Moreover, compound semiconductor structure 11 provides a preferred depletion mode or normally on FET device that has advantages for advanced multi-phase power conversion applications because, among other things, a depletion mode device has a lower series resistance compared to an enhancement mode device.

Furthermore, structure 11 can handle more current per phase in a multiphase power conversion application compared to silicon-based or enhancement mode devices. For example, for a 120 A/500 kHz application, three phases are required with structure 11 compared to four for a silicon-based device. For a 120 A/1 MHz application, four phases are required with structure 11 compared to 5 for a silicon-based device. For a 120 A/2 MHz application, four phases are sufficient using structure 11 compared to seven for a silicon-based device. This also enables a smaller system size thereby saving on pc board space, which makes the structure according to the present invention a cost effective alternative for high power/high frequency applications.

Figure 4:
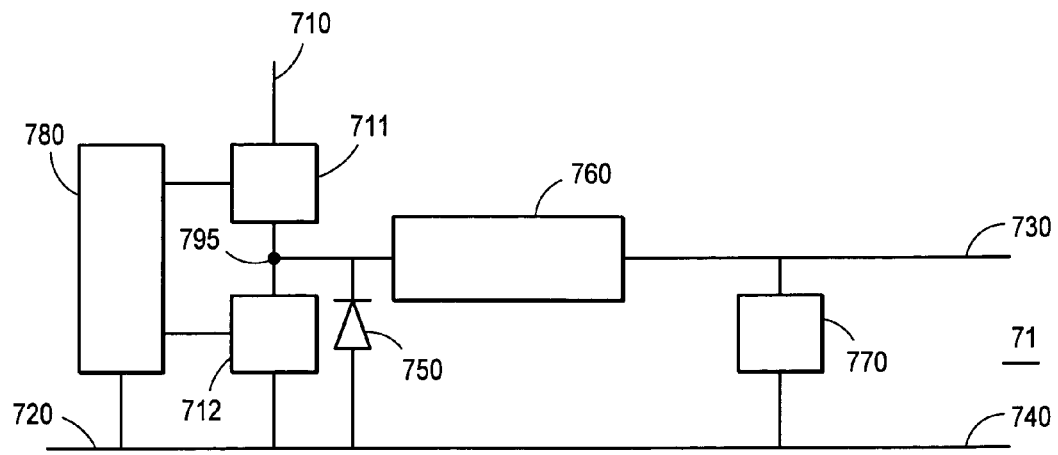
FIG. 4 illustrates a circuit diagram of a dc/dc buck converter according to the present invention incorporating a device of FIG. 1.

Turning now to FIG. 4, a dc/dc buck converter circuit 71 according to the present invention is described. Circuit 71 includes at least one n-channel depletion mode or normally on compound semiconductor FET device. Converter circuit 71 is a two-port network having a positive input terminal 710, a positive output terminal 730, and a negative input terminal 720 connected to a negative output terminal 740. In a preferred embodiment described hereinafter, circuit 71 includes two n-channel depletion mode compound semiconductor FET devices 711 and 712. Alternatively, at least one of FETs 711 and 712 comprise an n-channel depletion mode compound semiconductor FET device. Preferably dc/dc converter circuit 71 comprises switching FET devices 711 and 712 based on semiconductor double trench vertical FET structure 11 shown in FIG. 1.

First n-channel depletion mode compound semiconductor vertical FET or switch 711 is connected between positive input terminal 710 and an internal node 795. Second n-channel depletion mode compound semiconductor vertical FET or switch 712 is connected between internal node 795 and common negative terminals 720 and 740. A gate driver or control circuit 780 is connected to the gate leads of first FET 711 and second FET 712, and functions to switch FETs 711 and 712 between current conducting and current blocking states. One or more inductors 760 are connected between internal node 795 and positive output terminal 730. A cathode of a rectifier diode 750 is connected to internal node 795, and an anode is connected to common negative terminals 720/740. A capacitor or capacitors 770 is connected across output terminals 720/740.

Control circuit 780 generates two switching signals with a delay between them. One control signal is applied to the gate of first n-channel depletion mode FET 711, and the second control signal is applied to the gate of second n-channel depletion mode FET 712 in order to switch the two FET devices on and off. The phase difference between the two control signals ensures that one FET device is always in a non-conducting state. When FET device 711 is in a current conducting state, FET device 712 is held in a current blocking state and vice versa. Under this condition, a voltage source placed across input terminals 710 and 720 causes a dc current in a path entering positive input terminal 710, passing through first n-channel depletion mode FET 711 and inductor 760, and capacitor 770 out positive output terminal 730 through a load (not shown), into negative output terminal 740, and out negative input terminal 720 returning to the voltage source.

When first n-channel depletion mode FET device 711 is in a current blocking state, second n-channel depletion mode FET device 712 is held in a current conducting state. Under this condition, energy stored in inductor 760 causes a dc current to flow through inductor 760, through capacitor 770 and out positive output terminal 730 and through a load (not shown). The current path proceeds through negative output terminal 740 through second n-channel depletion mode FET 712 back to inductor 760.

Control circuit 780 is operated, for example, as a pulse width modulator that controls the level of dc output voltage. Control waveforms applied to the gate leads of depletion mode FET devices 711 and 712 can be considered a series of negative pulses in which a negative pulse switches an n-channel depletion mode FET device into a current blocking state. The dc output voltage is then proportional to the ratio of negative pulse time to waveform period time. Holding the waveform in a high state holds a depletion mode FET device in a current blocking state, while holding the waveform in a low state holds a depletion mode FET device in a current conducting state. One advantage of circuit 71 is that it is not dependent on synchronization with a transformer voltage with gate drive signals for control and synchronous FET devices.

Figure 5:
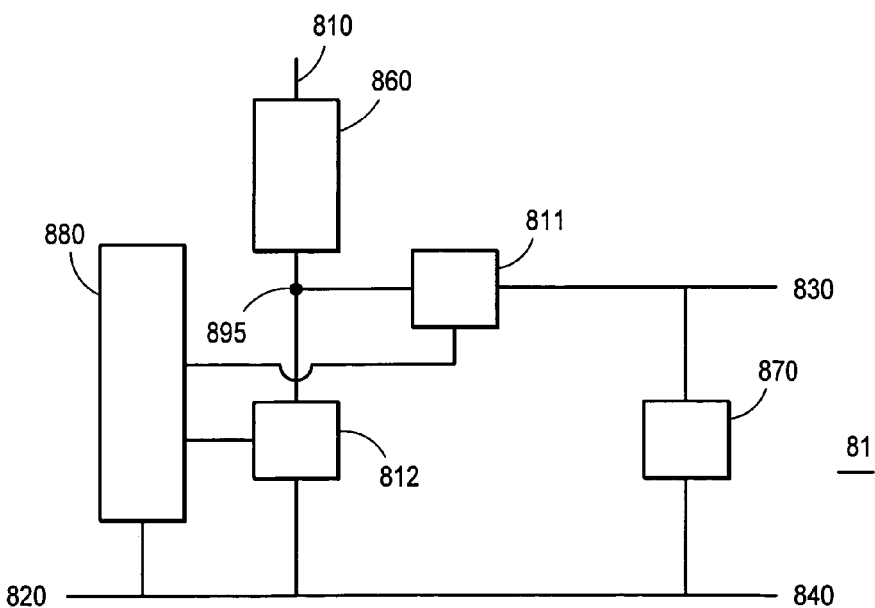
FIG. 5 illustrates a circuit diagram of a dc/dc boost converter according to the present invention incorporating a device of FIG. 1.

Turning now to FIG. 5, a dc/dc boost converter circuit 81 according to the present invention is described. Circuit 81 includes at least one n-channel depletion mode or normally on compound semiconductor device. Converter circuit 81 is a two-port network having a positive input terminal 810, a positive output terminal 830, and a negative input terminal 820 connected to a negative output terminal 840. In a preferred embodiment described hereinafter, circuit 81 includes two n-channel depletion mode compound semiconductor FET devices 811 and 812. Alternatively, at least one of FETs 811 and 812 comprise an n-channel depletion mode compound semiconductor FET device. Preferably dc/dc converter circuit 81 comprises switching FET devices 811 and 812 based on semiconductor double trench vertical FET structure 11 shown in FIG. 1.

First n-channel depletion mode compound semiconductor vertical FET or switch 811 is connected between positive output terminal 830 and an internal node 895. Second n-channel depletion mode compound semiconductor vertical FET or switch 812 is connected between internal node 895 and common negative terminals 820 and 840. A gate driver or control circuit 880 is connected to the gate leads of first FET 811 and second FET 812, and functions to switch FETs 811 and 812 between current conducting and current blocking states. One or more inductors 860 are connected between internal node 895 and positive input terminal 810. A capacitor or capacitors 870 is connected across output terminals 820/840.

Control circuit 880 generates two switching signals with a delay between them. One control signal is applied to the gate of first n-channel depletion mode FET 811, and the second control signal is applied to the gate of second n-channel depletion mode FET 812 in order to switch the two FET devices on and off. The phase difference between the two control signals ensures that one FET device is always in a non-conducting state.

When first FET device 811 is in a current conducting state, second FET device 812 is held in a current blocking state. Under this condition, a voltage source placed across input terminals 810 and 820 causes a dc current in a path entering positive input terminal 810, passing through inductor 860 through first n-channel depletion mode FET 811 and capacitor 870 out positive output terminal 830 through a load (not shown), into negative output terminal 840, and out negative input terminal 820 returning to the voltage source.

When first n-channel depletion mode FET device 811 is in a current blocking state, second n-channel depletion mode FET 812 is held in a current conducting state. Under this condition, FET 812 is switched on and current flows from input terminal 810 through inductor 860 and FET 812, which ramps up the inductor current. Once FET 812 is switched off, the voltage on its drain rises and it forward biases the body diode of FET 811. The body diode then starts to conduct the inductor current.

After a dead time delay, control circuit 880 sends a gate signal to FET 811, which turns FET 811 on. In this mode the inductor current is diverted from the body diode to the channel region of FET 811. Once FET 811 is switched off, its body diode conducts once more until the dead time lapses and FET 812 is switched on. For a short time afterwards, the reverse recovery charge of FET 811 diode is dissipated through FET 812. FET 812 is now on once more, and the cycle repeats itself.

Control circuit 880 is operated, for example, as a pulse width modulator that controls the level of dc output voltage. Control waveforms applied to the gate leads of depletion mode FET devices 811 and 812 can be considered a series of negative pulses in which a negative pulse switches an n-channel depletion mode FET device into a current blocking state. The dc output voltage is then proportional to the ratio of negative pulse time to waveform period time. Holding the waveform in a high state holds a depletion mode FET device in a current blocking state, while holding the waveform in a low state holds a depletion mode FET device in a current conducting state.

Thus it is apparent that there has been provided, in accordance with the present invention, a dc/dc power converter including a depletion mode compound semiconductor FET switching device. The switching device reduces gate charging effects, gate resistance effects, reverse recovery times, and on resistance thereby improving power conversion performance.

Although the invention has been described and illustrated with reference to specific embodiments thereof, it is not intended that the invention be limited to these illustrative embodiments. For example, the structure according to the present invention is suitable for other power conversion systems. Additionally, although an n-channel depletion mode switching device is shown, a p-channel depletion mode device is suitable. Those skilled in the art will recognize that modifications and variations can be made without departing from the spirit of the invention. Therefore, it is intended that this invention encompass all such variations and modifications as fall within the scope of the appended claims.

I claim:

1. A dc/dc converter comprising:
   an inductor coupled to one of a positive output terminal and a positive input terminal;
   a first depletion mode compound semiconductor switching FET connected to the inductor and configured to control current flow in the inductor;
   a control circuit coupled to a gate of the first depletion mode compound semiconductor switching FET for switching the first depletion mode compound semiconductor switching FET between an on state and an off state; and
   a capacitor coupled to the positive output terminal and a negative terminal.

2. The dc/dc converter of claim 1 wherein the first depletion mode compound semiconductor switching FET comprises a GaAs n-channel depletion mode junction field effect transistor.

3. The dc/dc converter of claim 1 further comprising a second depletion mode compound semiconductor switching FET coupled to the first depletion mode compound semiconductor FET and the control circuit and configured to control current flow in the inductor.

4. The dc/dc converter of claim 1 wherein the second depletion mode compound semiconductor switching FET comprises a GaAs n-channel depletion mode junction field effect transistor.

5. The dc/dc converter of claim 1 further comprising:
   a second switching FET device coupled to the negative terminal and the control circuit; and
   a diode having a cathode and an anode, wherein the anode is coupled to the negative terminal and the cathode is coupled between the inductor and the first depletion mode compound semiconductor switching FET, and wherein the first depletion mode compound semiconductor switching FET is connected to the positive input terminal, and wherein the inductor is coupled to a source of the first depletion mode compound semiconductor switching FET and the positive output terminal to form a buck converter.

6. The dc/dc converter of claim 5 wherein the second switching FET comprises a depletion mode compound semiconductor switching FET device.

7. The dc/dc converter of claim 6 wherein one of the first and second depletion mode compound semiconductor switching FETs comprises a GaAs n-channel depletion mode JFET.

8. The dc/dc converter of claim 6 wherein both the first and second depletion mode compound semiconductor switching FETs comprise GaAs n-channel depletion mode JFETs.

9. The dc/dc converter of claim 1 further comprising a second depletion mode compound semiconductor switching FET device coupled to a negative terminal and the control circuit, and wherein the inductor is coupled between the positive input terminal and a drain of the first depletion mode compound semiconductor switching FET device to form a boost converter.

10. The dc/dc converter of claim 9 wherein one of the first and second depletion mode compound semiconductor switching FETs comprises a GaAs n-channel depletion mode junction field effect transistor.

11. The dc/dc converter of claim 9 wherein both the first and second depletion mode compound semiconductor switching FETs comprise GaAs n-channel depletion mode junction field effect transistors.

12. The dc/dc converter of claim 1 wherein the first depletion mode compound semiconductor switching FET comprises:
- a body of semiconductor material comprising a first conductivity type, wherein the body of semiconductor material has an upper surface and a lower surface opposing the upper surface, wherein the lower surface provides a drain contact;
- a first trench formed in the body of semiconductor material and extending from the upper surface, wherein the first trench has a first width, a first depth from the upper surface, first sidewalls, and a first bottom surface;
- a second trench formed within the first trench, wherein the second trench has a second width, a second depth from the first surface, second sidewalls and a second bottom surface;
- a first source region formed in the body of semiconductor material extending from the upper surface and spaced apart from the first trench; and
- a doped gate region formed in at least a portion of the second sidewalls and the second bottom surface, wherein the doped gate region comprises a second conductivity type.

13. The device of claim 12 wherein the body of semiconductor material comprises GaAs.

14. A dc/dc converter network comprising:
- a first vertical trench gate compound semiconductor depletion mode FET device;
- an inductor connected to the first FET device and one of a positive input terminal and a positive output terminal;
- a gate control device connected to the first FET device;
- a second vertical trench gate compound semiconductor depletion mode FET device connected to a negative terminal, the gate control device and the first vertical trench compound semiconductor depletion mode FET device; and
- a capacitor connected to the positive output terminal.

15. The dc/dc converter network of claim 14 wherein one of the first and second vertical trench gate compound semiconductor depletion mode FET devices comprises a GaAs n-channel depletion mode junction field effect transistor.

16. The dc/dc converter network of claim 14 wherein the first and second vertical trench gate compound semiconductor depletion mode FET devices comprise GaAs n-channel depletion mode junction field effect transistors.

17. A dc/dc converter circuit including:
- an inductor connected to one of a positive input terminal and a positive output terminal;
- a first GaAs depletion mode vertical trench gate JFET device connected to the inductor;
- a second GaAs depletion mode vertical trench gate JFET device connected to the first JFET device and a negative terminal;
- a gate control device connected to the first and second JFET devices; and
- a capacitor connected to the positive output terminal and the negative terminal.

18. The dc/dc converter circuit of claim 17 wherein one of the first and second GaAs depletion mode vertical trench gate JFET devices comprises an n-channel device.

* * * * *